United States Patent [19]
Peer

[11] 3,940,661
[45] Feb. 24, 1976

[54] DEFLECTION SYSTEM WITH OVERSCAN PROTECTION

[75] Inventor: John Charles Peer, Indianapolis, Ind.

[73] Assignee: RCA Corporation, New York, N.Y.

[22] Filed: Feb. 10, 1975

[21] Appl. No.: 548,182

[52] U.S. Cl. ............... 315/370; 315/371; 315/395
[51] Int. Cl.² ........................................ H01J 29/56
[58] Field of Search ........... 315/370, 371, 386, 387, 315/389, 395

[56] References Cited
UNITED STATES PATENTS

| | | | |
|---|---|---|---|
| 3,648,099 | 3/1972 | Otten et al. | 315/371 |
| 3,649,870 | 3/1972 | Maulsby | 315/371 |

*Primary Examiner*—Maynard R. Wilbur
*Assistant Examiner*—T. M. Blum
*Attorney, Agent, or Firm*—E. M. Whitacre; Paul J. Rasmussen

[57] ABSTRACT

In a deflection system including an oscillator and an amplifier providing scanning current for a deflection winding, a parabolic voltage developed at the deflection winding is superimposed on the oscillator direct current operating voltage in such a proportion that an increased parabolic voltage level, indicative of excessive scanning current from either an overscan or low operating frequency condition, causes the oscillator to operate at a higher frequency which decreases the deflection winding current and therefore the parabolic voltage and thereby permits the use of less expensive circuit components having lower maximum voltage level ratings.

5 Claims, 9 Drawing Figures

DEFLECTION SYSTEM WITH OVERSCAN PROTECTION

BACKGROUND OF THE INVENTION

This invention relates to a deflection system overscan protection circuit for reducing excessive voltage and current generated by the deflection system.

In deflection systems, such as the vertical deflection system utilized in television receivers for providing scanning current for electromagnetic deflection coils, it is common to utilize oscillators synchronized by received sync pulses to provide the proper time base for the scanning current waveforms. The oscillators usually are of a free running type, and, with no sync pulse present, have their free running frequency adjusted to be somewhat less than the sync pulse frequency to enable reliable synchronization when the sync pulses are present.

To minimize circuit costs it is common practice to utilize circuit elements, such as resistors and capacitors, which have resistance and capacitance tolerances of 10 and 20 percent. Normally such utilization causes no problems because variable controls are utilized to set the frequency and amplitude of the deflection waveforms. However, to accomplish this the variable controls must have a relatively wide range of control to compensate for the tolerance variations of elements in a given circuit. Thus, for example, it is not uncommon for the free running frequency range of a vertical rate deflection oscillator having a normal frequency of 60 Hz to extend as low or lower than 40 Hz and as high or higher than 80 Hz.

At the relatively low vertical deflection rates, 50 or 60 Hz, utilized in most countries today the deflection coils present primarily a resistive load to the scanning current obtained from the deflection amplifier. The scanning current is generally a linear sawtooth waveform with some amount of nonlinearity added to provide "S-shaping" to ensure a linear raster as viewed on the picture tube viewing screen. Thus, the voltage and current of the scanning waveform increases substantially linearly with time. If for some reason the vertical oscillator frequency, or hold, control element is misadjusted, or there is some fault in the television receiver, or both, the vertical oscillator could operate in its free running condition at a much lower frequency, increasing the time between cycles and thereby increasing the scanning waveform voltage and current in the deflection amplifier. Because some of the deflection amplifier circuit elements such as capacitors may have a maximum voltage rating selected to be satisfactory under most operating conditions, such an overscan condition would result in the requirement of higher voltage ratings of the particular circuit element, increasing the receiver cost. Similarly, if the deflection waveform amplitude, or size, control were adjusted to an extreme providing a maximum current and voltage scanning waveform, particular circuit elements in the deflection amplifier could also be overstressed, requiring higher voltage rating devices. The worst condition could be when both the size control and the hold control were inadvertently set to result in scanning waveform increase in current and voltage. It is desirable to provide some inexpensive and automatic arrangement for reducing the effects of an overscan condition.

SUMMARY OF THE INVENTION

A deflection system overscan protection circuit includes an oscillator coupled to a deflection amplifier which in turn is coupled to a deflection winding for providing scanning current thereto. A parabolic voltage developed at the deflection system output circuit is coupled to the oscillator and superimposed on the oscillator direct current operating voltage such that a change in the amplitude of the parabolic voltage, which change is indicative of a change in the scanning waveform current and voltage, causes the oscillator to change its frequency, thereby changing the peak current and voltage of the scanning waveform coupled to the deflection winding.

A more detailed description of the invention is given in the following description and accompanying drawing of which:

FIG. 1 is a circuit diagram of a deflection system embodying an overscan protection circuit according to the invention; and FIGS. 2a–2h are normalized waveform diagrams illustrating the operation of the circuit of FIG. 1.

DESCRIPTION OF A PREFERRED EMBODIMENT OF THE INVENTION

Figures 1, 2A, 2B, 2C, 2D, 2E, 2F, 2G, 2H:
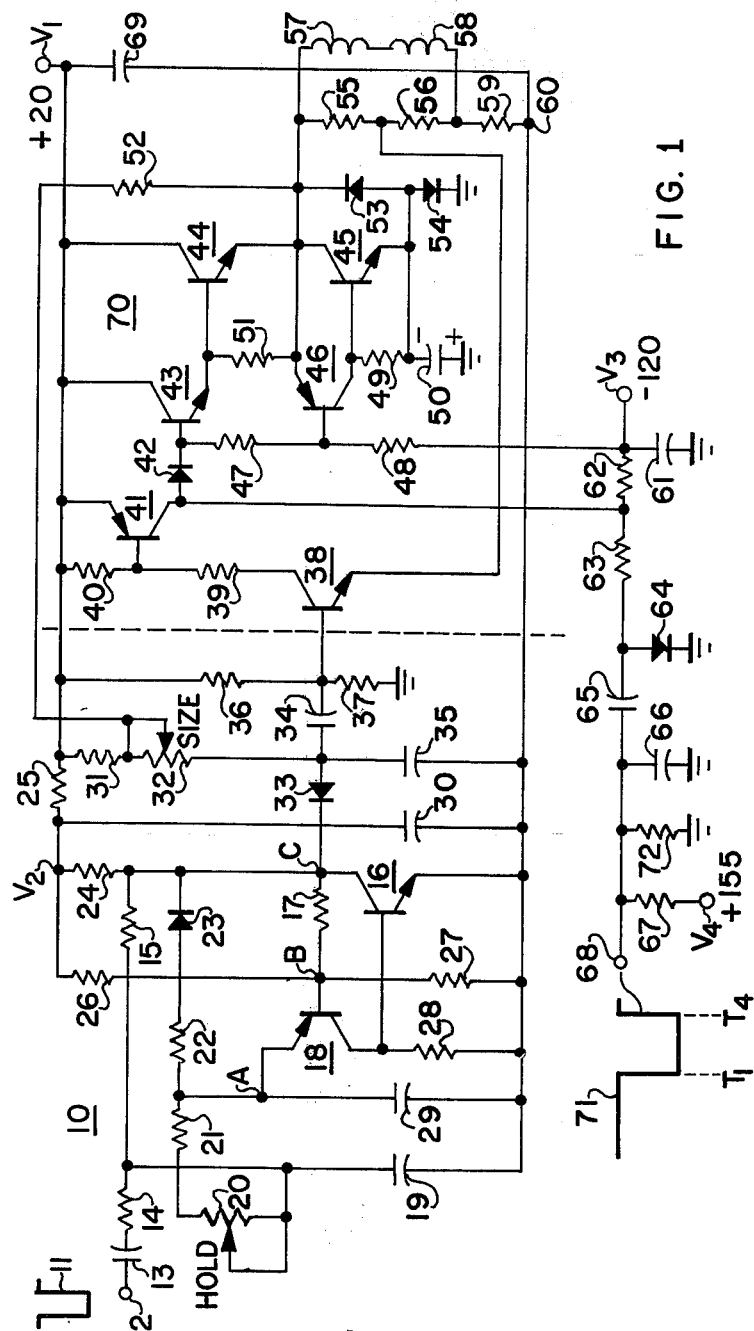

A deflection system with overscan protection according to the invention as illustrated in FIG. 1 is divided into two portions for ease of explanation: to the left of the vertical dotted line is an oscillator portion 10 and reference sawtooth waveform circuitry and to the right of the vertical dotted line is a deflection amplifier portion 70.

The oscillator portion 10 comprises two transistors 16 and 18 coupled to oscillate in a free running manner in the absence of sync pulses. Transistor 16 has its emitter coupled to a terminal 60 and its collector coupled through a resistor 24 to a source of operating potential indicated as terminal $V_2$. Terminal $V_2$ is coupled through a resistor 25 to a source of operating potential labeled as terminal $V_1$. $V_1$ may be in the order of +20 volts DC. The value of resistors 36 and 37 are chosen so that the voltage at terminal 60 is approximately +10 volts. The voltage at terminal $V_2$ with respect to terminal 60 is then approximately +10 volts. The base electrode of transistor 16 is coupled to the collector of transistor 18 and through a resistor 28 to terminal 60. The emitter electrode of transistor 18 is coupled to the junction of capacitor 29, resistor 21 and resistor 22. The other terminal of capacitor 29 is coupled to terminal 60, the other terminal of resistor 22 through a diode 23 to the collector of transistor 16 and the junction of resistors 15, 24, 17 and diode 33. The other terminal of resistor 21 is coupled through a potentiometer 20 which serves as a frequency or hold control, to the capacitor 19. Resistors 26 and 27 are serially coupled between terminal $V_2$ and 60. The values of resistors 26, 27 and 17 are selected to provide a bias of approximately two-thirds the $V_2$ voltage at the base electrode of transistor 18 when transistors 18 and 16 are not conducting and a bias of one-third the $V_2$ voltage when transistors 16 and 18 are conducting. A source of vertical deflection rate sync pulses 11 is coupled to a first input terminal 12 of the oscillator and through a coupling capacitor 13, resistor 14, resistor 15 and resistor 17 to the base of transistor 18.

A horizontal rate filter capacitor 30 is coupled between terminals $V_2$ and 60. A resistor 31, a size or amplitude controlling potentiometer 32 and a capacitor 35 are serially coupled between terminals $V_1$ and 60. A voltage divider comprising serially coupled resistors 36 and 37 is coupled between terminal $V_1$ and ground, the junction of the resistors being coupled to the base of transistor 38 to provide bias thereto and through a coupling capacitor 34 and a diode 33 to the collector electrode of transistor 16. The junction of diode 33 and capacitor 34 is coupled to the junction of size control 32 and capacitor 35.

The amplifier portion 70 comprises transistors 38 and 41 connected as an amplifier stage and transistors 43, 44, 45 and 46 connected as a quasi-complementary symmetry power amplifier. Transistor 38 has its collector coupled through resistors 39 and 40 to terminal $V_1$ and its emitter coupled to the junction of serially coupled resistors 55 and 56 which are coupled in parallel with a deflection winding comprising coils 57 and 58. The base of transistor 41 is coupled to the junction of resistors 39 and 40, its emitter is coupled to terminal $V_1$ and its collector is coupled through a diode 42 to the base of transistor 43. The base of transistor 43 is also coupled through resistors 47 and 48 to a terminal $V_3$ supplying a potential of $-120$ volts. The junction of resistors 47 and 48 is coupled to the base of transistor 46. The collector of transistor 43 is coupled to terminal $V_1$ and its emitter is coupled to the base of transistor 44 and through a resistor 51 to the emitter of transistor 46. The collector emitter paths of output transistors 44 and 45 are serially coupled between terminal $V_1$ and the anode of diode 54, the cathode of which is grounded. The collector of transistor 46 is coupled through a resistor 49 and to the anode of diode 54 and to a terminal of a capacitor 50, the other terminal of which is grounded. A diode 53 is coupled across the collector-emitter electrodes of transistor 45, and the output terminal formed by the junction of the emitter of transistor 44 and the collector of transistor 45 is coupled to the cathode of diode 53 and the junction of resistor 55 and deflection coil 57 and emitter of transistor 46. Yoke coupling capacitor 69, which has its value selected to provide S-shaping, is coupled to terminal $V_1$ and to common terminal 60. A current feedback resistor 59 is coupled from terminal 60 to the junction of resistor 56 and deflection coil 58.

A blanking and grid bias circuit comprising resistors 62, 63, 67 and 72, capacitors 61, 65 and 66, and a diode 64 is arranged as indicated with one terminal of resistor 62 being coupled to the anode of diode 42 and the other terminal of resistor 62 coupled to resistor 48 and to terminal $V_3$.

In operation, sync pulses 11 coupled to oscillator 10 cause transistor 18 to conduct and the collector current through resistor 28 develops a voltage which is coupled to the base of transistor 16 which also causes it to conduct if the voltage at point A is positive enough as a result of the charging of capacitor 29. Timing capacitor 29 then discharges through transistor 18 through the base-emitter junction of transistor 16 and also through resistor 22 and diode 23 and down through the collector-emitter path of transistor 16 to terminal 60. At the same time, the sawtooth generating capacitor 35 is discharged through diode 33 and the collector-emitter path of transistor 16 to terminal 60. When capacitor 29 is discharged to one-third $V_2$, transistor 18 cuts off which cuts off transistor 16, and timing capacitor 29 charges from the $V_2$ supply through resistors 24 and 15, the hold control 20 and resistor 21 to terminal 60. The charge across capacitor 29 is indicated by the generally sawtooth voltage waveform A illustrated in FIG. 2d.

Sawtooth reference capacitor 35 is charged from the $V_1$ supply through resistor 31 and from the output terminal through resistor 52 and through size control potentiometer 32 to terminal 60. The voltage at terminals B and C of oscillator 10 are illustrated by their respective voltage waveforms B and C of FIGS. 2e and 2f, respectively. The value of the voltages at points A, B and C as a fraction of the operating voltage $V_2$ is indicated. Waveform B is determined primarily by the voltage division provided by resistors 26 and 27 and 17 with respect to terminal 60.

During the retrace interval, which is illustrated by the interval $T_1 - T_4$ of FIGS. 2a–2f, FIGS. 2d, 2e and 2f indicate that transistors 18 and 16 are simultaneously conducting during the period $T_1 - T_2$, which represents approximately 70 microseconds of an approximate 700 millisecond retrace period, $T_1 - T_4$. The period $T_1 - T_2$ can be selected to be any time up to the full retrace time.

In the absence of incoming sync pulses 11, oscillator 10 free runs at a rate adjusted by the setting of hold control 20. As capacitor 29 charges and the voltage at terminal A exceeds the voltage at terminal B by the base-emitter drop of transistor 18, transistor 18 conducts which turns on transistor 16 which discharges capacitor 35 which initiates the retrace cycle as described above.

Capacitor 19 serves to filter any horizontal deflection rate components from the incoming vertical sync pulses to reduce the possiblity of spurious triggering of the oscillator. Similarly, resistor 25 and capacitor 30 form a filter network for filtering horizontal deflection rate components from the $V_1$ supply to reduce the possibility of spurious triggering of oscillator 10. Care must be taken in the selection of the valves of resistor 25 and capacitor 30 to ensure that this network will not filter vertical deflection rate components as it is desired to add these components to the $+V_2$ supply in a manner to be described subsequently.

The positive going sawtooth wave which is the charging voltage across capacitor 35, the amplitude of which is controlled by the adjustment of size potentiometer 32 in the charging circuit, is coupled through capacitor 34 and superimposed on the DC bias level established at the junction of resistors 36 and 37 and coupled to the base of transistor 38. The positive going sawtooth waveform causes the amplifier 70 to drive a sawtooth current through coils 57 and 58 during the entire trace period of each vertical deflection cycle during the time interval $T_0 - T_1$. The first half or negative half of the trace current waveform (FIG. 2b) causes transistors 46 and 45 to conduct, transistor 45 conducting scanning current from the bottom side of coupling capacitor 69 through current feedback resistor 59, deflection coils 58 and 57, transistor 45, to the anode of diode 54. During the second portion of the trace interval, transistors 46 and 45 are cut off and the drive waveform at the cathode of diode 42, similar to the waveform of FIG. 2a, causes transistors 43 and 44 to conduct, reversing the current through the yoke as scanning current now flows from the positive supply at terminal $V_1$ through transistor 44, deflection coils 57 and 58, and resistor 59 to the negative terminal of coupling capacitor 69.

At the end of the trace interval at $T_1$ the sudden negative transition of the sawtooth reference waveform at the base of transistor 38 caused by the quick discharge of capacitor 35 through diode 33 and transistor 16 causes transistors 38 and 41 to stop conducting, which condition lasts for the remainder of the retrace period $T_1 - T_4$. With both of transistors 44 and 45 cut off, a relatively large negative retrace pulse is formed during the interval $T_1 - T_3$, as indicated by the deflection yoke voltage waveform of FIG. 2a, as yoke current is supplied from the negative terminal of capacitor 50 through diode 53 and through deflection windings 57 and 58 in a resonant manner. Diode 54 is a disconnect diode which permits the voltage at the junction of deflection coil 57 and diode 53 to go negative with respect to ground. At $T_2$ the yoke current has decayed to zero and capacitor 50 is charged to approximately its peak negative value. Now the current reverses coming from the negative terminal of capacitor 69 through elements 59, 58, 57, 45 and 46 to 50. At $T_3$ the half cycle of resonant energy exchange between capacitor 50 and coil windings 57 and 58 is finished and the yoke current is almost completely reversed as illustrated by the yoke current waveform of FIG. 2b. During the interval $T_3 - T_4$ diode 54 is again forward biased and yoke current flows through transistor 45 and diode 54 to ground. During $T_3 - T_4$ the yoke current which passes through feedback resistor 59 reaches its most negative value at time $T_4$, the resulting negative voltage at the emitter of transistor 38 in relation to its rising base voltage causes transistors 38 and 41 to conduct, initiating the start of the next trace interval.

Resistors 55 and 56 coupled across windings 57 and 58 form a voltage divider which provides feedback to the emitter of transistor 38 for the purpose of cancelling any horizontal rate components picked up by vertical coils 57 and 58.

It is desirable that a vertical blanking pulse be able to blank a picture tube electrode for the full retrace interval $T_1 - T_4$ and not just for a time corresponding to the retrace pulse $T_1 - T_3$. Such full retrace interval blanking is provided in the following manner. During the trace interval, transistor 41 is conducting as described above and a portion of its collector current flows through resistor 63 and diode 64 to ground, clamping the junction of diode 64 and capacitor 65 at slightly above ground potential. From $T_0 - T_1$, the voltage level of blanking waveform 71 is determined by the voltage developed at the junction of the voltage divider consisting of resistors 67 and 72 coupled between $V_4$ and ground. At $T_1$, the start of the retrace period, transistor 41 is cut off as described above and remains cut off until the end of the retrace period $T_4$. No collector current flows and a negative voltage is coupled from the $V_3$ supply through resistors 62 and 63 and capacitor 65 to terminal 68. This negative voltage provides the blanking and is selected to be more negative than the retrace voltage present at the amplifier output terminal and the base of transistor 43. Therefore, during $T_1 - T_4$ diode 42 blocks the output voltage from the blanking voltage and thereby maintains the blanking voltage at terminal 68 at its selected negative value for the full retrace time $T_1 - T_4$. Capacitor 66 acts as a filter to bypass any horizontal rate energy present at the kinescope electrode. Thus, it is the action in the retrace circuit of clamping diode 64 and blocking diode 42 to provide a clean full width and constant amplitude retrace pulse.

Capacitor 69 is selected to be of a value to provide S-shaping correction of the deflection coil current and is also selected to be small enough in value to provide approximately a 4 volt peak-to-peak negative going parabolic voltage at terminal 60 with respect to ground. It is noted that terminal 60 is not grounded and is the common return bus for the oscillator section 10. Therefore, the operating voltage across the oscillator is the voltage at terminal $V_2$ with respect to terminal 60. The DC component of this operating voltage at terminal 60 is determined by the voltage divider comprising resistors 36 and 37 and is maintained by the negative DC feedback from terminal 60 to the emitter of transistor 38. The amount of $V_1$ voltage dropped across resistor 25 is small, just enough to filter any horizontal pick up on $V_1$. The voltage at terminal $V_2$ with respect to terminal 60 is illustrated in FIG. 2c. It is noted that $V_2$ actually varies with time in accordance with the positive going parabolic waveform seen from terminal 60 to $V_2$.

The normal synchronized operation of the oscillator was described above. In the event that sync pulses 11 are not present, the oscillator will free run also as described above at a frequency adjusted by the hold control 20. Assuming that component tolerances are stacked for a low free running frequency and/or that the hold control has been set such that the free running frequency was considerably lower than the normal synchronizing frequency, the scanning waveform voltage and current developed in the amplifier output section would increase inversely proportional to the free running frequency. The peak-to-peak parabolic voltage developed at terminal 60 similarly would increase and the operating voltage $V_2$ of the oscillator would also reflect this increase. Such a condition is illustrated by the waveforms in FIG. 2g in which the solid line curves $V_2$ and B indicate a normal voltage condition at terminals $V_2$ and B in the oscillator, and the dashed curves $V_2'$ and B' indicate the voltage at these terminals during the low frequency condition creating the undesirably high scanning current and voltage. In FIG. 2g, waveform B indicates that the retrace period is initiated at $T_1$ which may be considered to be the point in time in which the oscillator voltage at B is 0.7 volts negative with respect to point A. This condition can occur when the negative going sync pulses force point B to that level, or, in the absence of sync, when capacitor 29 has charged positive enough to bring point A to this condition, or, in accordance with the invention, when the parabolic component of $V_2$ brings point B down to the conduction point of transistor 18. With the higher voltage condition caused by the absence of sync and the lower free running frequency, the voltage of curve B' at $T_1$ has not decreased to the level $T_L$ required to trigger the oscillator and the new trace interval would normally not terminate until $T_1'$. However, the increased peak-to-peak parabolic voltage component B' has steeper rise and fall portions at its beginning and end portions during the trace interval and, hence, the voltage waveform B' as it decreases reaches the triggering level $T_L$ at a time $T_1''$ which occurs before $T_1'$. At $T_1''$, transistors 18 and 16 conduct to initiate the retrace interval. This forced premature conduction relative to $T_1'$ results in an increased frequency of oscillation with a resulting decrease in scanning current and thereby a decrease in the peak retrace voltage. In this manner, circuit components such as tantalum capacitor 50, transistor 43 and transistor 44 in the amplifier output circuit are protected against excessive voltage stress during abnormal misadjustment conditions. This protection arrangement according to the invention permits the use of considerably less expensive components with a resultant cost savings.

As described above, an excessive voltage and current condition can also exist if size potentiometer 32 is incorrectly adjusted. This situation is illustrated by the dotted curves $V_2'$ and $B'$ in FIG. 2h. The normal frequency of oscillation would result in a trace period extending from $T_0$ to $T_1$. However, the greater parabolic voltage component at terminal 60 caused by greater scanning current results in a greater amplitude parabolic component on $V_2'$ with a resulting larger parabolic voltage at terminal B, illustrated as voltage waveform $B'$ in FIG. 2h. The increased amplitude parabolic waveform $B'$ has a more rapidly falling trailing edge and hence reaches the oscillator triggering level $T_L$ at a time $T_1''$ occurring before $T_1$. This causes the transistors 18 and 16 to conduct at $T_1''$ and initiate retrace. This increased frequency of operation results in decreased scanning current and thus decreased retrace voltage waveforms with a resultant decrease in the voltage rating of critical components in the deflection amplifier. It is noted that should both an excessively low frequency condition and an excessively large size condition occur simultaneously, the protective effects of the circuit according to the invention are cumulative. Also, as the protection circuit automatically acts to decrease an overscan condition, the effect automatically decreases as the condition is corrected.

The following is a tabulation of circuit element values utilized in the circuit of FIG. 1.

| | | | |
|---|---|---|---|
| R14 | 68k | R40 | 8.2k |
| R17 | 330k | R47 | 1.2k |
| R21 | 56k | R48 | 120k |
| R22 | 1.8k | R49 | 680 |
| R24 | 47k | R51 | 680 |
| R25 | 10k | R52 | 1m |
| R26 | 330k | R55 | 22k |
| R27 | 330k | R56 | 100 |
| R28 | 150k | R59 | 1 |
| R31 | 390k | R62 | 560k |
| R32 | 350k | R63 | 22k |
| R36 | 3.9m | R67 | 1m |
| R37 | 3.9m | R72 | 390k |
| R39 | 22k | R15 | 68k |
| R20 | 350k | | |
| C13 | .01µf | C50 | 2.7µf (50v) |
| C19 | 4700µµf | C61 | .01µf |
| C29 | .1µf | C65 | .068µf |
| C30 | .01µf | C66 | 270µµf |
| C34 | .22µf | C69 | 820µf |
| C35 | .22µf | | |
| Q16 | 2N4401 | Q43 | MPSA06 |
| Q18 | 2N4403 | Q44 | 2N5294 |
| Q38 | 2N4410 | Q45 | 2N5294 |
| Q41 | MPSA56 | Q46 | 2N4401 |
| D23 | IN3062 | D53 | IN4004 |
| D33 | IN3062 | D54 | IN4004 |
| D42 | IN3070 | D64 | IN3062 |

What is claimed is:

1. A deflection system overscan protection circuit, comprising:
   an oscillator for producing a generally sawtooth waveform;
   a deflection winding;
   an amplifier coupled to said oscillator and said deflection winding and responsive to said sawtooth waveform for providing a generally sawtooth scanning current to said deflection winding;
   means for obtaining a parabolic voltage waveform from said deflection winding, which parabolic voltage waveform is proportional to the amount of scanning current through said deflection winding, and for coupling said parabolic voltage to said oscillator for superimposing said parabolic voltage on a direct current operating voltage of said oscillator such that a change in said parabolic voltage causes said oscillator to change its frequency, thereby changing the peak amplitude of said scanning current.

2. A deflection system overscan protection circuit according to claim 1 wherein said means includes a capacitor coupled to said deflection winding and a point of reference potential for developing said parabolic voltage waveform.

3. A deflection system overscan protection circuit according to claim 2 wherein said oscillator includes a switching device coupled to a timing circuit, said device being responsive to amplitude changes of said parabolic waveform superimposed on said operating voltage for altering the frequency of said oscillator.

4. A deflection system overscan protection circuit according to claim 3 wherein said capacitor is coupled in series with said deflection winding, said capacitor being further coupled in parallel with operating voltage terminals of said oscillator for applying said superimposed direct current operating voltage and said parabolic voltage to said operating voltage terminals for controlling the frequency of said oscillator.

5. A deflection system overscan protection circuit according to claim 3 wherein the frequency of said oscillator is proportional to the magnitude of said parabolic waveform.

\* \* \* \* \*